United States Patent
Goldberg

(10) Patent No.: US 7,205,552 B2
(45) Date of Patent: Apr. 17, 2007

(54) MONATOMIC BORON ION SOURCE AND METHOD

(75) Inventor: Richard David Goldberg, Hove (GB)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/132,438

(22) Filed: May 19, 2005

(65) Prior Publication Data

US 2005/0274904 A1    Dec. 15, 2005

Related U.S. Application Data

(62) Division of application No. 10/394,665, filed on Mar. 24, 2003, now Pat. No. 6,905,947.

(30) Foreign Application Priority Data

Mar. 28, 2002 (GB) ................... 0207398.9

(51) Int. Cl.
*H01L 21/425* (2006.01)
*H01J 7/24* (2006.01)

(52) U.S. Cl. ............. 250/423 R; 250/427; 250/492.21; 315/111.81; 438/514; 438/515

(58) Field of Classification Search .................... None
See application file for complete search history.

(56) References Cited

U.S. PATENT DOCUMENTS

| 5,013,604 A * | 5/1991 | Allen et al. ................. 428/402 |
| 6,013,332 A * | 1/2000 | Goto et al. .................. 427/530 |
| 6,452,338 B1 * | 9/2002 | Horsky .................. 315/111.81 |
| 7,022,999 B2 * | 4/2006 | Horsky et al. .............. 250/427 |

* cited by examiner

*Primary Examiner*—Nikita Wells
(74) *Attorney, Agent, or Firm*—Boult Wade Tennant

(57) ABSTRACT

Monotomic boron ions for ion implantation are supplied from decaborane vapour. The vapour is fed to a plasma chamber and a plasma produced in the chamber with sufficient energy density to disassociate the decaborane molecules to produce monatomic boron ions in the plasma.

8 Claims, 1 Drawing Sheet

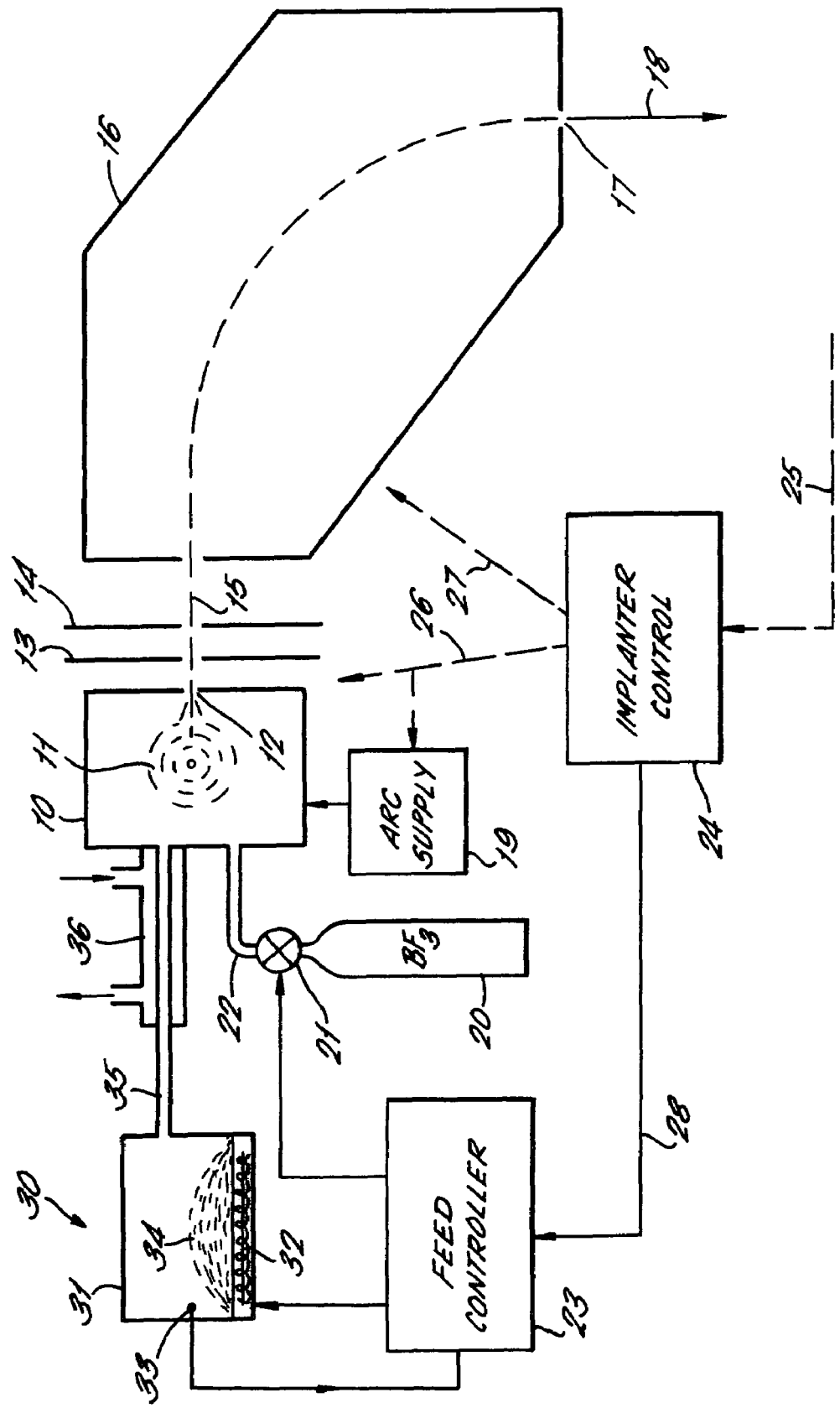

MONATOMIC BORON ION SOURCE AND METHOD

CROSS REFERENCE TO RELATED APPLICATION

This is a division of U.S. application Ser. No. 10/394,665, filed Mar. 24, 2003, now U.S. Pat. No. 6,905,947.

FIELD OF THE INVENTION

This invention relates to a source of, and a method of providing, monatomic boron ions for ion implantation.

BACKGROUND OF THE INVENTION

Boron is a well known dopant used for modifying the conductivity of semiconductor materials in the manufacture of integrated electronic circuits. Monatomic boron ions ($B^+$) are commonly implanted into silicon for this purpose. A typical ion source used for generating an ion beam containing monatomic boron ions uses $BF_3$ gas as the feed gas to the usual plasma chamber of the ion source. In the ion source, the $BF_3$ gas is disassociated in the plasma to form $B^+$ ions, often as well as $BF^+$ and $BF_2^+$. The ion beam extracted from the ion source is passed through a mass analyser to select the $B^+$ ions for onward transmission for implanting in the semiconductor wafer target.

It is also known to use decaborane ($B_{10}H_{14}$) as a feed stock for an ion source in ion implantation. Decaborane is used to produce ions each comprising up to 10 boron atoms. Such $B_xH_y^+$ ions can be used to implant boron atoms at relatively low energies.

Decaborane Ion Implantation by Perel et al, IIT 2000, pp. 304 to 307, discloses the spectrum of ion masses which may be generated from a suitably controlled ion source employing decaborane as feed stock. Ions having masses corresponding to the presence of 10 boron atoms are selected in a mass analyser for implantation.

U.S. Pat. No. 6,288,403 discloses an ion source adapted for the preferential production of decaborane ions, particularly for low energy implantation.

SUMMARY OF THE INVENTION

The present invention provides a method of providing monatomic boron ions for ion implantation, comprising supplying decaborane vapour into a plasma chamber, and generating a plasma in said plasma chamber having a sufficient energy density to disassocite decaborane molecules to produce monatomic boron ions in the plasma.

In the present invention, decaborane vapour is fed to the plasma chamber in order to provide a supply of boron atoms in the plasma to enhance the current of monatomic boron ions which can be extracted from the source. At least initially, a different plasma supporting gas may be supplied to the plasma chamber of the ion source, such as $BF_3$ or Ar. The plasma supporting gas allows a stable plasma to be established initially in the plasma chamber. When the plasma chamber is hot enough, the flow of supporting gas can be backed off in favour of the decaborane vapour. A relatively high energy density plasma is maintained within the plasma chamber and the decaborane vapour provided in the plasma chamber is then dissociated in the plasma to provide monatomic boron for inclusion in the extracted ion beam.

The invention also provides a source of monatomic boron ions for an ion implanter, comprising a plasma chamber, decaborane vapour supply, a supply of a plasma supporting gas, other than decaborane vapour, an energy supply to said plasma chamber to form a plasma therein having an energy density sufficient to disassociate decaborane molecules to produce monatomic boron, and a controller to control said decaborane vapour supply and said supporting gas supply to provide a simultaneous supply to the plasma chamber of decaborane vapour and said supporting gas.

It may be convenient to ensure that a feed conduit of the decaborane vapour supply to the plasma chamber is cooled so that the decaborane vapour is kept below 300° C. before entering the plasma chamber. This helps prevent dissociation of the decaborane before entering the plasma chamber and reduces deposition of the dissociation products in the feed conduit.

Normally, the ion source is used in combination with a mass selector set up to form a beam of monatomic boron ions for transmission to the substrate to be implanted.

BRIEF DESCRIPTION OF THE DRAWING

An example of the invention will now be described with reference to the accompanying drawing which is a schematic diagram of an ion source embodying the invention and in combination with a mass selector.

DETAILED DESCRIPTION OF THE PREFERRED EMBODIMENT

Referring to the drawing, an ion source has a plasma chamber 10 in which feed gas is ionised to form a plasma 11 containing ions of an atomic species to be implanted in a substrate (not shown). Ions are extracted from the plasma chamber 10 through an extraction aperture 12, by means of an extraction electric field formed by suitably biased extraction electrodes 13,14. The extracted ions are accelerated by electrodes 13 and 14 to form an ion beam 15 which is directed into a mass analyser 16. The mass analyser may, in accordance with known practice, be a magnetic sector analyser, in which ions, entering the analyser 16 with the selected momentum, pass through the analyser in a path with a curvature such that the selected ions pass through a mass selection slit 17 at the exit of the analyser, to form a beam of mass selected ions 18, for onward transmission to a process station of an ion implanter which is not shown in this drawing.

The plasma chamber 10 may be a DC arc type plasma chamber, in which energy is delivered to maintain the plasma in the chamber, from an arc supply 19. The arc chamber arrangement may, for example, be the well known Bernas-type, in which thermionic electrons emitted by a cathode in the chamber are confined to an axial region of the arc chamber by means of an applied magnetic field.

Feed gas is supplied to the arc chamber 10 to maintain a desired partial pressure within the arc chamber sufficient to support plasma 11. In known ion sources, a beam of boron ions is produced by feeding $BF_3$ gas to the arc chamber. Within the arc chamber the arc supply 19 is controlled to generate a plasma of sufficient energy density to disassociate the $BF_3$ molecules and to form within the plasma ions of $B^+$, as well as $BF^+$, and possibly $BF_2^+$. If it is desired that beam 18, for transmission to the implant process chamber, is a beam of $B^+$ ions, the mass analyser 16 is set to reject other ions generated in the arc chamber and extracted in the initial beam 15. Clearly, in order to maximise the $B^+$ current in beam 18 from the mass selector, the arc chamber 10 is operated to maximise the proportion of B⁺ ions in the plasma 11.

In accordance with standard practice, the $BF_3$ feed gas supply to arc chamber 10 comprises a gas bottle 20 connected via a control valve 21 and a feed conduit 22, into the interior of the plasma chamber 10. The rate of supply of $BF_3$ gas to the arc chamber 10 is controlled by the control valve 21 under the supervision of feed gas supply controller 23. The feed gas supply controller 23 itself receives supervisory control data from an implanter control system 24, which receives various sense parameter data from the implanter system over a generalised input line 25, and supplies control parameter data to control the overall functioning of the implanter, over generalised output control lines 26, 27, as well as control line 28 to the feed controller 23.

In addition to the $BF_3$ gas supply illustrated in the figure, the described example of the invention includes a decaborane vapour supply, indicated generally at 30. The decaborane vapour supply 30 comprises an oven 31 fitted with a heater 32, the heat output of which is controlled by the feed controller 23 in response to temperature feedback, from temperature sensor 33.

The oven 31 contains a mass of decaborane powder 34 which is heated to a temperature at which the decaborane powder sublimes to provide a desired decaborane vapour pressure. Decaborane vapour is fed along conduit 35 from the oven 31 to supply the decaborane vapour to the interior of the arc chamber 10.

A vapour supply control valve, not shown in the figure, may also be included in the vapour conduit 35, to control the rate of flow of vapour from the oven 31 into the arc chamber 10. The control valve is then subject also to control by the feed controller 23.

Decaborane powder has a vapour pressure of the order of 0.1 Torr at room temperature, and produces a substantial vapour pressure at temperatures above 100° C. However, at temperatures much above 300° C., the decaborane molecule tends to dissociate. Within the arc chamber 10, the walls of the arc chamber may be at temperatures of between 500° C. and as much as 1000° C. Furthermore, the arc supply 19 is such that the plasma 11 has an energy intensity which would tend to dissociate substantially all decaborane molecules within the plasma region. The resulting increased number of monatomic boron atoms substantially boosts the monatomic boron ion concentration within the plasma 11, permitting the extraction of relatively higher monatomic boron ion currents from the plasma chamber 10, resulting in an increase in the B⁺ current in mass selected beam 18.

As mentioned above, the decaborane molecule is unstable at temperatures above about 300° C. At such higher temperatures, the molecule dissociates and the resulting fragment molecules, including monatomic boron, have a much lower vapour pressure at those temperatures and therefore tend to deposit out as solid boron. In order to prevent decaborane vapour from dissociating and depositing out within the conduit 35, the conduit 35 is cooled, especially at its connection with the plasma chamber 10, by means of a cooling jacket 36. The coolant may be water. The cooling jacket 36 is controlled to ensure that the conduit 35 is held at a sufficient temperature to maintain the required vapour pressure of decaborane, but below the temperature (about 300° C.) at which the decaborane tends to dissociate. In this way, the decaborane vapour can be fed directly into the interior of the plasma chamber 10 without dissociating, thereby ensuring a proper supply of the decaborane into the plasma chamber and avoiding deposition of decaborane products within the conduit 35.

Inside the plasma chamber 10, the decaborane vapour quickly dissociates to enrich the B⁺ content of the plasma 11.

In operating the plasma chamber 10 with decaborane vapour feed as described above, the arc within the chamber 10 is first formed using $BF_3$ feed alone at a predetermined rate of supply. Then decaborane vapour is added to the feed to produce the desired B⁺ enrichment of the plasma. The rate of supply of $BF_3$ gas may then be reduced. In order to maintain a stable plasma of substantial energy density within the chamber 10, some $BF_3$ gas may be supplied continuously simultaneously with the decaborane vapour. However, in some arrangements it may be possible to reduce the second rate of $BF_3$ supply to zero and to run the plasma on decaborane vapour alone.

A primary function of the $BF_3$ feed gas is to facilitate starting the plasma and then, when supplied simultaneously with decaborane vapour, to maintain plasma stability. This functionality could be achieved by alternate supporting gases compatible with the desired process. For example the decaborane vapour could be run simultaneously with argon gas, where the argon provides plasma stability and the decaborane vapour enriches the plasma with B⁺ ions.

The feed gas supply controller 23 may be arranged to optimise the ratio of supply of the decaborane vapour and the plasma supporting gas such as $BF_3$, so as to maximise the B⁺ current in the extracted beam, while controlling or limiting the deposition of boron in the plasma chamber and ensuring a stable plasma.

In the described example, the plasma chamber 10 is constituted by an arc chamber, and the plasma generating energy is derived from an arc supply 19. Instead, the energy required to create the plasma within the plasma chamber can be derived from other sources, including radio frequency or microwave sources. Any suitable arrangement may be employed for extracting ions from the plasma chamber including a so-called tetrode system with four electrodes including the front face of the plasma chamber with the extraction aperture.

Also, although a single aperture 12 for extraction of the plasma to form the ion beam 15 is illustrated in the drawing, multiple apertures may be provided, for example for enhancing the total beam current drawn from the chamber. Further, the disclosed magnetic sector analyser 16 is just one form of mass analyser which may be used with the described system.

What is claimed is:

1. A source of monatomic boron ions for an ion implanter, comprising
   a plasma chamber,
   decaborane vapour supply,
   a supply of a plasma supporting gas, other than decaborane vapour, an energy supply to said plasma chamber to form a plasma therein having an energy density sufficient to disassociate decaborane molecules to produce monatomic boron, and
   a controller to control said decaborane vapour supply and said supporting gas supply to provide a simultaneous supply to the plasma chamber of decaborane vapour and said supporting gas.

2. A source of monatomic boron ions as claimed in claim 1, wherein said supporting gas supply provides a supply of $BF_3$.

3. A source of monatomic boron ions as claimed in claim 1, wherein said supporting gas supply provides a supply of Ar.

4. A source of monatomic boron ions as claimed in claim 1, wherein said decaborane vapour supply includes a feed conduit, having a portion connected to said plasma chamber, for supplying said decaborane vapour to said plasma chamber, and a cooler associated with said feed conduit to maintain said feed conduit including said portion connected to said plasma chamber below 300° C.

5. A source of monatomic boron ions as claimed in claim 1, wherein said plasma chamber has an extraction aperture, and the source includes a biased electrode to extract ions from the chamber and a mass selector to form a beam of monatomic boron ions from the extracted ions.

6. A source of monatomic boron ions as claimed in claim 1, wherein said controller is operative to reduce this rate of simultaneous supply of the supporting gas when the plasma chamber reaches a desired temperature.

7. A source of monatomic boron ions for an ion implanter, comprising:
a plasma chamber,
a decaborane vapour supply,
said vapour supply including a feed conduit having a portion, connected to said plasma chamber, for applying said vapour to said plasma chamber, and a cooler associated with said feed conduit to maintain said feed conduit including said portion connected to said plasma chamber below 300° C., and
an energy supply to said plasma chamber to form a plasma therein having an energy density sufficient to dissociate decaborane molecules to produce monatomic boron ions, said energy supply and said plasma chamber being arranged to be operable so that the plasma chamber is at temperatures at which decaborane molecules dissociate.

8. A source of monatomic boron ions as claimed in claim 7, wherein said energy supply and said plasma chamber are arranged to be operable so that the plasma chamber is at temperatures above 500°.

* * * * *